United States Patent
Mazzillo

(10) Patent No.: US 8,487,396 B2
(45) Date of Patent: Jul. 16, 2013

(54) TRENCH SIDEWALL CONTACT SCHOTTKY PHOTODIODE AND RELATED METHOD OF FABRICATION

(75) Inventor: Massimo Cataldo Mazzillo, Corato (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 91 days.

(21) Appl. No.: 13/207,719

(22) Filed: Aug. 11, 2011

(65) Prior Publication Data

US 2011/0291103 A1 Dec. 1, 2011

Related U.S. Application Data

(63) Continuation-in-part of application No. 12/790,390, filed on May 28, 2010.

(30) Foreign Application Priority Data

Jun. 1, 2009 (IT) .............................. VA2009A0033
Aug. 12, 2010 (IT) .............................. VA2010A0060

(51) Int. Cl.
*H01L 29/47* (2006.01)

(52) U.S. Cl.
USPC ........... 257/471; 257/473; 257/475; 257/484; 257/E31.093; 438/534; 438/575; 438/576

(58) Field of Classification Search
USPC .. 257/471, 473, 475, 484, E31.093; 438/534, 438/575, 576
See application file for complete search history.

(56) References Cited

U.S. PATENT DOCUMENTS

| 5,093,576 A | 3/1992 | Edmond et al. .......... 250/370.01 |
| 7,002,156 B2 | 2/2006 | Sandvik et al. .......... 250/370.11 |
| 2008/0047600 A1 | 2/2008 | Ohashi et al. ................. 136/255 |
| 2010/0301445 A1 | 12/2010 | Mazzillo ....................... 257/450 |
| 2011/0079869 A1 | 4/2011 | Mazzillo ....................... 257/443 |

OTHER PUBLICATIONS

Razeghi et al., "Semiconductor Ultraviolet Detectors," Journal of Applied Physics, American Institute of Physics, New York, vol. 79, No. 10, May 15, 1996, pp. 7433-7473.
Mazzillo et al., "Highly Efficient Low Reverse Biased 4H-SiC Schottky Photodiodes for UV-Light Detection," Photonics Technology Letters, IEEE, Oct. 2009, pp. 1-4.

*Primary Examiner* — Tan N Tran
(74) *Attorney, Agent, or Firm* — Allen, Dyer, Doppelt, Milbrath & Gilchrist, P.A.

(57) ABSTRACT

A Schottky photodiode may include a monocrystalline semiconductor substrate having a front surface, a rear surface, and a first dopant concentration and configured to define a cathode of the Schottky photodiode, a doped epitaxial layer over the front surface of the monocrystalline semiconductor substrate having a second dopant concentration less than the first dopant concentration, and parallel spaced apart trenches in the doped epitaxial layer and having of a depth less than a depth of the doped epitaxial layer. The Schottky photodiode may include a metal filler in the parallel spaced apart trenches to form a Schottky rectifying contact with the doped epitaxial layer, an anode current distributor metal layer on a surface of the doped epitaxial layer and in electrical contact with the metal filler of the parallel spaced apart trenches, a dielectric passivation layer on the anode current distributor metal layer, and a conductive metal layer over the rear surface of the monocrystalline semiconductor substrate and configured to provide an ohmic contact with the cathode.

26 Claims, 11 Drawing Sheets

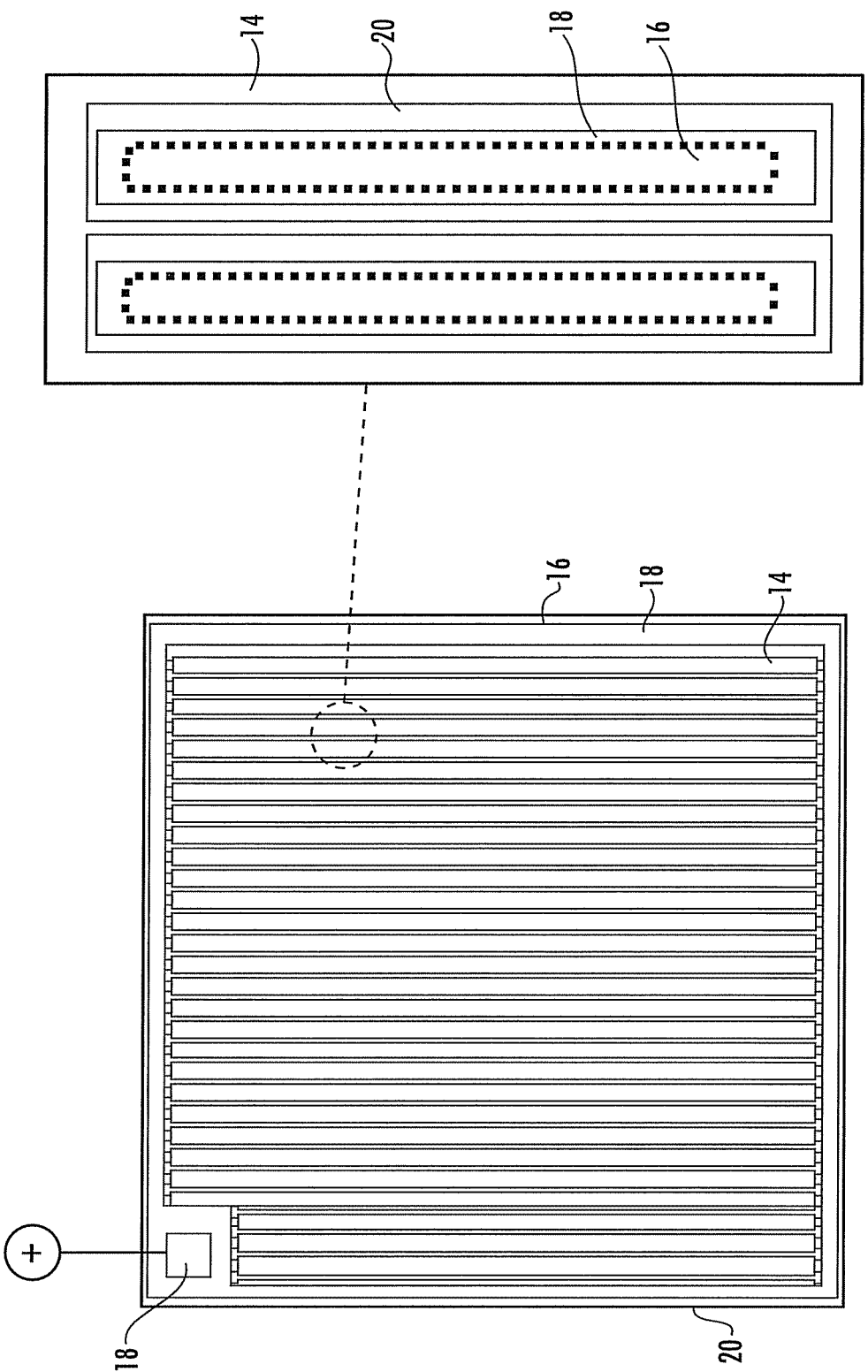

TRENCH SIDEWALL CONTACT SCHOTTKY PHOTODIODE AND RELATED METHOD OF FABRICATION

CROSS-REFERENCE APPLICATION

The present application is a continuation-in-part of parent application U.S. patent application Ser. No. 12/790,390, filed May 28, 2010, the contents of which are hereby incorporated by reference in their entirety, and claims priority to Italian Application No. VA2010A000060, filed Aug. 12, 2010, the contents of which are also hereby incorporated by reference in their entirety.

FIELD OF THE INVENTION

The present disclosure relates to the field of photo-detectors, and, more particularly, to a Schottky photodiode photo-detector and related methods.

BACKGROUND OF THE INVENTION

Ultraviolet (UV), vacuum ultraviolet (VUV), and extreme ultraviolet (EUV) (5-380 nm) photo-detectors have been widely used in the field of astronomy, EUV lithography, x-ray microscopy, plasma physics, UV curing and flame detection monitoring. Another relevant application is for non-line-of-sight (NLOS) communications. A wireless optical communication system relies on an optical wave with wavelength ranging from infrared, visible light, to UV to convey information. Compared with an RF system, it shows several potential advantages, such as huge unlicensed bandwidth, low-power and miniaturized transceiver, higher power densities, high resistance to jamming, and potential increase of data rate. In the wireless optics domain, infrared and UV waves are very valuable carriers.

Large unregulated bandwidth, which is virtually free of multiple access interference conditions, is commercially attractive while inherent security characteristics receive the military's attention. Similar to a radio frequency (RF) link, a typical wireless optical communication link comprises of an information source, modulator, transmitter, propagation channel, and receiver. To generate an optical source, solid state light-emitted diodes (LEDs), laser tubes and solid state laser diodes (LD) can be used. For detection, the optical receiver may comprise a lens-focusing and filtering sub-system, photo-detector (normally a photo-multiplier based on a vacuum tube), and post detection processor. Optical lenses and filters are made of selected wavelength-sensitive materials to extract the desired optical field. The photo-detector is made of photosensitive materials and produces free electrons with incident photons. Of course, a high sensitivity detector that does not use filters (to block the visible light), lens and vacuum tubes would be quite advantageous for system miniaturization.

Many UV applications use detectors with high responsiveness, very low dark current, and good radiation hardness. In astrophysics, blindness to visible solar radiation is also extremely important, especially for solar study in the EUV region, where the signals are relatively weak and the out-of-band signals, such as the visible components of the solar background, are often many orders of magnitude stronger than the EUV signal of interest. In the consumer sector, solar blind UV detectors would avoid the low efficiency and errors typical of infrared detectors when directly exposed to the solar light or strongly illuminated. NLOS communications in many consol applications that need to communicate with terminals that may intermittently become obscured by physical obstacles (play stations) could also be an area of application.

In recent years, a remarkable progress in the epitaxial growth technologies and in device processing of wide band gap semiconductors, including SiC, has been accomplished, which to date allows the fabrication of p-i-n, avalanche, metal-semiconductor-metal and Schottky barrier devices for UV detection. Photo-detectors use a low dark current, so high quality electronic materials may be necessary. Wide band gap semiconductors offer an ideal dark current that can be several orders of magnitude lower than silicon. In particular, 4H—SiC has an electronic quality that makes it reliably approach the ideal dark current even in relatively large diameter wafers. Moreover, as the only material among the known wide band gap semiconductors, 4H—SiC to have been tested for UV detection with the highest cutoff wavelength at 380 nm ($E_g$=3.26 eV) below the low end of the visible wavelength range (400 nm) and has been proved to be a very promising candidate for the development of visible-blind UV detectors [1].

Some publications have reported p-i-n and avalanche UV detectors realized on SiC with good UV photo detection [2]. For example, U.S. Pat. No. 5,093,576 to Edmond et al. discloses a pn junction photodiode formed in a silicon carbide substrate [3], and U.S. Pat. No. 7,002,156 to Sandvik et al. discloses a detection system including a SiC avalanche photodiode for use in harsh environments [4].

However, in order to enhance sensitivity at short wavelengths, metal-semiconductor (Schottky) diodes are preferred to p-i-n and junction diodes, as the carrier generation occurs in the space-charge region, i.e. at the semiconductor surface, with high built-in electric field. Moreover, Schottky diodes are majority carrier devices, thus allowing a faster response than p-n junctions. Finally, Schottky diodes typically have a simpler fabrication processes than p-i-n and junction structures. Metal-semiconductor photodiodes are particularly used for detection of high photon rates fluxes in the ultraviolet and visible-light regions. In fact, the absorption coefficients $\alpha$ in these regions is very high, of the order of $10^4$ $cm^{-1}$ or more, for most of the common semiconductors, which corresponds to an effective absorption length $1/\alpha$ of 1.0 μm or less. However, in Schottky photodiodes to avoid large reflection and absorption losses when the diode is illuminated from the top, the metal film should to be very thin while antireflection coatings may be used to reduce the metal shining. A Metal-Semiconductor photodiode is disclosed in U.S. Pat. No. 4,763,176 to Masanori.

Typical Schottky-type SiC UV photodiodes use "semi-transparent" continuous thin metal layers (<20 nm) with high values [1.4-1.8 eV] of the Schottky barrier on SiC (Ni, Au, Pt) [6]. However, these Schottky-type devices show a relatively low sensitivity in the wavelength range 200-250 nm, due to the low penetration depth of the UV radiation in the metal. In order to improve the quantum efficiency of SiC photo-detectors, one approach includes further reducing the thickness of the semitransparent film [7]. However, this approach can lead to a difficult control of the uniformity of an ultra thin Schottky barrier, beyond being detrimental for the mechanical and thermal stabilities of the contact.

The direct exposure to radiation of the optically active area, i.e. the depletion region of the junction, could be an alternative to improve the detector sensitivity at short wavelengths. With this aim, approaches such as planar p-i-n structures, with the intrinsic region directly exposed to radiation, or innovative semitransparent Schottky metallizations are actually under study. For example, metal-semiconductor-metal 4H—SiC photodiodes, using Ni/ITO interdigit contacts, were recently proposed by Chiou allowing the Schottky operation and the optically active area direct radiation exposure [6]. Finally, Sciuto et al. in [6] demonstrated high responsiveness 4H—SiC vertical Schottky UV photodiodes based on the pinch-off surface effect, obtained by way of self-aligned Nickel Silicide interdigit contacts. These planar detectors with the active area directly exposed to the optical flux allow an improvement of the sensitivity at short wavelengths [6].

The absorption coefficient of the electromagnetic radiation in silicon carbide decreases at a great rate for long wavelengths. Cha et al. in [8] disclose the absorption coefficient spectrum in 4H—SiC. As it can be seen in this reference, the absorption coefficient decreases at a great rate for wavelengths longer than 280-290 nm, due to the loss of efficiency of the absorption mechanisms (indirect transitions) for photons of these wavelengths. At 350 nm, for example, the absorption length of 4H—SiC is 35 μm [9], that is about the 67% of the incident optical flux at this wavelength is absorbed in an active layer thick 35 μm. This means that it may be necessary to increase as much as possible the thickness of the active area in silicon carbide photodiodes in order to enhance the absorption and consequently the detection efficiency at the high wavelength end of the sensitivity range of the material. On the other hand, the lower the wavelength, the higher the absorption coefficient.

The feasibility of deep trenches etched in lightly doped thick SiC epitaxial layers and filled with metal has been demonstrated in various publications. Abbondanza et al. [10] disclose a method for growing low defect and high thickness (up to 150 microns) silicon carbide epilayers onto silicon carbide substrates. Likewise, the etching of high aspect ratio deep trenches (>100 μm) in silicon carbide using Deep Reactive Ion Etching (DRIE), as well as time-multiplexed etch-passivation (TMEP) process, which alternates etching with polymer passivation of the etch sidewalls, has been reported by various authors (for example, Evans et al [11]). Finally, S. Grunow et al. [12] discloses a method for forming conductive structures by filling trenches with a metal.

SUMMARY OF THE INVENTION

The structure disclosed herein may offer advantages over prior art structures and may be defined as a trench sidewall contact Schottky photodiode. Differently from planar devices, this structure may be a vertical semi-conducting device with one electrode in the bulk of the device and the other one at the rear of the wafer.

More specifically, the ohmic contact is on the bottom surface of the device while the rectifying (Schottky) contact is created in the bulk of the semiconductor by filling deep trenches etched in a lightly doped epitaxial layer with a high Schottky barrier metal. Application of a reverse bias of comparatively low value to the metal inside the trenches allows creation of wide depletion regions (active area of the device) all around the trenches due to a very light doping of the epitaxial layer.

The possibility of growing lightly doped silicon carbide epilayers of high thickness and low defects and to etch deep trenches of high aspect ratio in an epilayer of silicon carbide and fill them with high barrier Schottky metal, has been found to offer a powerful tool for modulating the thickness of the depletion layer (active area region) and thus to maximize the photodiode detection efficiency also at the high end of the sensitivity range, apart from short wavelength photons whose absorption is almost complete within a few microns from the impinged silicon carbide surface.

The pinch off condition among adjacent depletion regions around the metal strips inside the trenches corresponds to the condition of maximum detection efficiency because, in this case, all the silicon carbide area between neighboring metal filled trenches is active (i.e. depleted). The light doping of the epilayer allows creation of wide depletion regions at low reverse bias.

Therefore, by suitably designing the distance among adjacent trenches, the pinch-off condition can be reached at low reverse bias or even in a photovoltaic region (0 V bias). Because the structure disclosed herein has deep trenches filled with metal in thick highly doped epilayers, the pinch off condition not only is reached at a relatively low reverse bias, but also corresponds to the maximum detection efficiency condition in all the sensitivity ranges (for low as well as for high wavelengths) of silicon carbide semiconductor.

This condition is of paramount importance for possible application of a silicon carbide photo-detector in low power consumption applications where low reverse bias may be applied for the detection of weak photon fluxes in all the UV range (200-400 nm). Notably, some semiconductors may use photodiodes and their respective wavelength ranges of sensitivity include: Silicon: 190-1100 nm; Germanium: 400-1700 nm; Indium Gallium Arsenide: 800-2600 nm; and 4H—Silicon Carbide: 200-380 nm. The structure of trench sidewall contact Schottky photodiode may be realized using any of the above indicated semiconductors.

For example, fabrication of the photodiode structure in silicon or germanium would be much simpler than in silicon carbide because the epitaxial growth of lightly doped thick epitaxial layers on silicon and on germanium as well as etching and filling high aspect ratio trenches therein are long established standard processes of semiconductor device manufacturing. However, the different absorption spectrum of the material (for example, in silicon the absorption becomes negligible for wavelengths longer than 750-800 nm [13]) and the different barrier height of the Schottky contact formed between the metal inside the trenches and the lightly doped epilayer may need to be considered in designing the photodiode structure of this disclosure.

In the efficient photodiode structure that is obtained with the method of this disclosure, the thickness of the depleted region may be modulated by reducing the depth of trenches and eventually even the thickness of the lightly doped silicon carbide epilayer itself may be reduced in order to reduce the sensitivity of the device at higher wavelengths. In fact, the probability of absorption of high wavelength photons may be significantly lowered by reducing the thickness of the epilayers and using shorter trenches.

These trimmerable fabrication parameters may be profitably used in many applications where only photons with a wavelength shorter than a higher cut-off wavelength (for example, less than 300 nm for silicon carbide) may be selectively detected.

Finally, the metal electrode of the photodiode (typically tungsten or aluminum) set in deep trenches may greatly reduce unwanted cross talk effects among adjacent photodiodes in arrays of integrated photo-detectors or among neighboring points of the sensitive area of the single integrated photo-detector. Metal fillers such as W and Al have properties that may allow them to be deposited under conditions of highly conformal deposition at temperatures lower than 500° C. and are opaque to the radiation band of interest, which, for silicon carbide photodiodes, may be from 200 nm to 400 nm.

According to an embodiment, the depletion layer (active area region) may be modulated by a plurality of epitaxial layers of different thickness and/or with different spacing between the anode contacts and/or of different dopant concentration and/or of materials with different band-gap voltage, and making the anode metal trenches of sufficient depth to reach the innermost epitaxial layer, though without crossing it completely.

In the efficient photodiode structure, the thickness of the depleted region may be modulated by modulating the thickness and/or the dopant concentration and/or the material of the epitaxial layers, in order to reduce the sensitivity of the device at certain frequency bands.

These adjustable fabrication parameters may be profitably used in many applications where only photons with a wavelength shorter than a higher cut-off wavelength may be selectively detected. A plurality of architectures of photodiodes may be used for realizing a multi-pixel photo detector array having a distributed anode contact. A fabrication process of the architectures of Schottky photodiodes is also disclosed.

BRIEF DESCRIPTION OF THE DRAWINGS

FIG. 2 is a general layout view of an integrated trench sidewall contact Schottky photodiode, according to the present disclosure.

FIG. 3 is an enlarged detailed view of the layout profiles of the integrated regions of the trench sidewall contact Schottky photodiode structure, according to the present disclosure.

The cross sectional views and in general all the drawings have only a purely illustrative purposes. In particular, geometrical features are not drawn in scale, but to provide a quick recognition of their relative arrangement.

DETAILED DESCRIPTION OF THE PREFERRED EMBODIMENTS

Figure 1:
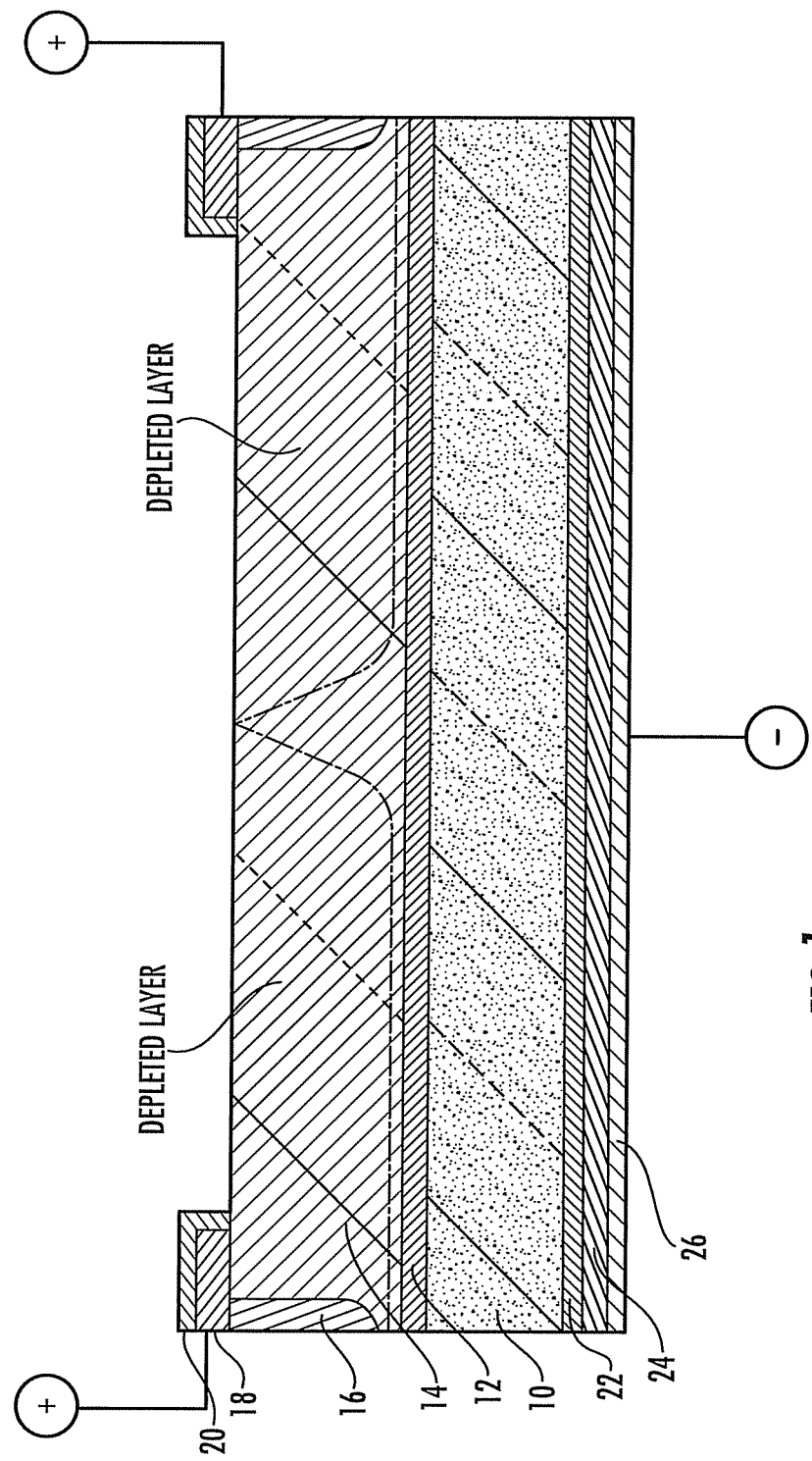
FIG. 1 is a cross-sectional view of an integrated trench sidewall contact Schottky photodiode, according to the present disclosure.
Figure 4:
FIGS. 4 to 14 are schematic side views illustrating steps of the fabrication process of a silicon carbide Schottky photodiode, according to the present disclosure.

An embodiment of the present disclosure may now be described in detail with reference to the drawing of FIG. 1, representing a cross sectional view in the active area of a trench sidewall contact Schottky photodiode of this disclosure. The photodiode structure according to the exemplary embodiment shown comprises a heavily doped, $N^+$ semiconductor substrate 10, a relatively thin N doped epitaxial buffer layer 12, grown on the substrate 10, and a second, relatively thick, lightly doped $N^{--}$ epitaxial layer 14, grown on the buffer epitaxial layer 12.

In case the semiconductor is nitrogen doped silicon carbide, according to an embodiment useful as photo-detector in the wavelength range of 200-380 nm, the dopant concentration of the substrate 10 may be in the range 1E18-1E19 atoms/cm$^{-3}$ and the dopant concentration of the thin epitaxial buffer layer 12 and of the thick epitaxial layer 14 may be in the ranges 1E17-1E18 atoms/cm$^{-3}$ and 1E13-1E15 atoms/cm$^{-3}$, respectively. The substrate may have a thickness in the range 350-400 µm, the epitaxial buffer layer 12 may have a thickness in the range 0.5-1 µm, and the lightly doped thick epitaxial layer 14 may have a thickness in the range 3-150 µm.

The heavily doped substrate 10 provides for a bottom cathode ohmic contact with an appropriate metallization of the whole rear surface of the substrate connectable to a photo-detector circuitry. The rear metallization may be a stack comprising a first barrier layer usually of titanium 22, a second layer 24 usually of nickel or platinum, and a topping layer 26 usually of gold, though other metallization stacks may be used.

The thin epitaxial layer 12 acts as buffer layer on which a thick lightly doped epilayer 14 may be grown. The light doping of the thick $N^{--}$ epitaxial layer 14 provides for wide space charge (i.e. depleted) regions in order to enhance collection efficiency of photogenerated carriers in the thick $N^{--}$ epilayer, even with a relatively low reverse bias. A tungsten, aluminum or other metal 16 fills the narrow and deep trenches (i.e. of high aspect ratio) cut in the thick lightly doped epilayer 14 for a depth insufficient to reach the bottom of the layer, establishing a Schottky rectifying contact with the semiconductor and constitutes the anode of the photodiode.

The equipotential characteristic of the Schottky metal filler of all the trenches belonging to a single integrated photodiode, that may be cut parallel to each other with a certain uniform spacing that may be about twice the maximum lateral extension of the depleted region in the lightly doped epilayer 14 at the design bias of the photodiode, is provided by a metal anode current collecting metal layer 18, for example of an aluminum-silicon-copper layer sputtered over the surface and defined to form a capping in electrical contact with the metal filler 16 of the trenches. Of course, in normal fabrication practices, the metal layer 18 of anode current distribution may be simultaneously defined over a plurality of integrated structures of photodiodes being fabricated on a same wafer for producing, by dicing of the wafer, single photo-detectors or "bit-arrays" each comprising a certain number of distinctly connectable photo-detectors, sharing a common cathode ohmic contact.

The profiles traced with dot-dash-dot lines show how a pinch-off condition of adjacent depleted regions should be reached at the design reverse bias voltage applied between cathode and anode of the photodiode (which in some applications may even be null and a pinch-off condition be nevertheless reached under purely photovoltaic regime (i.e. 0 V bias).

A common dielectric passivation coat layer 20, for example a partly oxidized silicon nitride layer, on the patterned metal anode current collector, completes the vertical structure of the trench sidewall contact Schottky photodiode of this disclosure. Of course, the metal anode current collecting metal layer 18 may have a pad area on which wire bonding connection of the anode to the photo-detector circuitry can be established.

A general layout view of an integrated trench sidewall contact Schottky photodiode of the above illustrated structure, showing an array of uniformly spaced parallel trench contacts and a corner pad area for wire bonding is provided in FIG. 2. FIG. 3 is an enlarged detail view of the layout profiles of the integrated regions of the trench sidewall contact Schottky photodiode structure.

An exemplary fabrication process flow relative to the manufacture of a trench sidewall contact Schottky photodiode of this disclosure with silicon carbide (SiC) may now be described with reference to FIGS. 4-14. With reference to the FIG. 4, on a monocrystalline semiconductor substrate in the form of a nitrogen doped $N^{++}$ silicon carbide slice 10, an optional though generally preferred, first relatively thin nitrogen doped epitaxial N layer 12 is grown on the front side of the substrate 10. The dopant concentration for the thin N epitaxial layer 12 may be approximately 1E17 or up to about 1E18 atoms/cm$^{-3}$ and its thickness may be approximately 0.5-1.0 μm.

Figure 5:
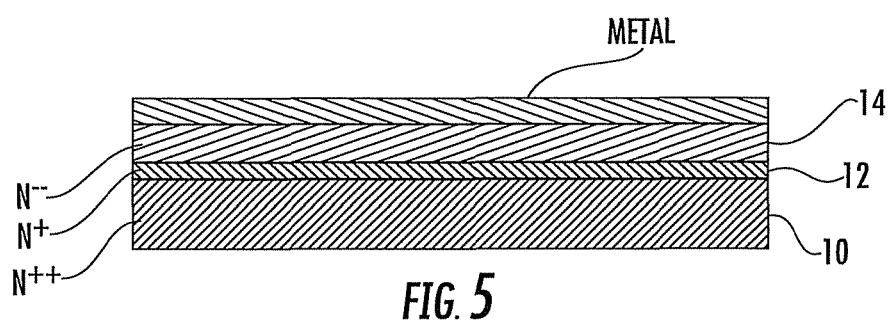

A second relatively thick nitrogen doped $N^{--}$ epitaxial layer 14 is grown over the first thin N epitaxial layer 12. The dopant concentration of the thick $N^{--}$ epitaxial layer 14 may be approximately 1E13 or up to about 1E15 atoms/cm$^{-3}$ and its thickness may be range from about 3 up to about 150 μm. The optional first epitaxial layer 12 acts as buffer layer on which growing the thick, lightly doped, active semi-conducting region 14 of wide space charge region from where photogenerated carriers at low reverse bias or even at 0V bias. A zero-layer photomask can be used for the definition of alignment marks according to common practices in the art. Then, as depicted in FIG. 5, a sacrificial metal layer (METAL) for example Nickel, or Aluminum, is sputtered on the front side of the wafer. The thickness of this metal layer may be in the range 1-10 μm, depending on the depth of the trench to etched in the lightly doped, thick epilayer 14 of $N^{--}$ silicon carbide.

Figure 6:
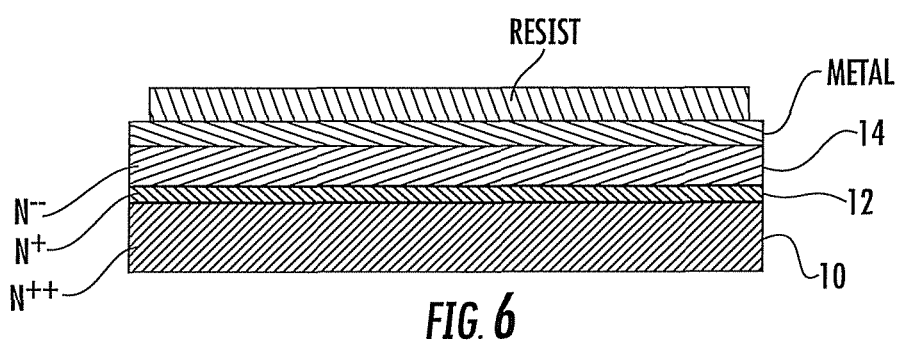
Figure 7:
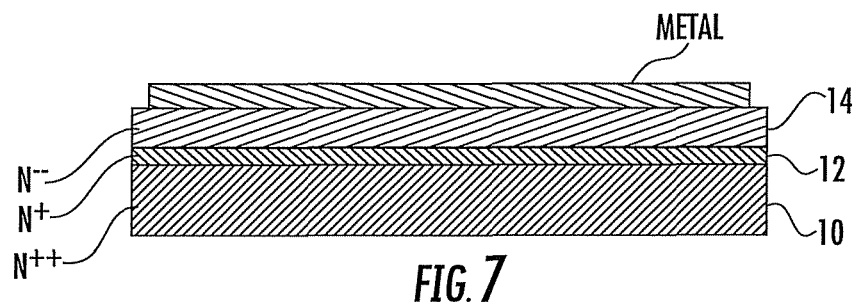

As depicted in FIG. 6, by a first lithography step, a resist mask (RESIST) defines an array of uniformly spaced parallel trenches (according to the exemplary layout views of FIGS. 2 and 3). Then, with a calibrated etch process (dry or wet) conducted through the openings of the resist mask (RESIST), the sacrificial metal layer (METAL) is removed completely from the areas (A) where trenches in the silicon carbide may be successively cut through the so defined openings in the metallic hard mask, and finally the resist mask is stripped off, as depicted in FIG. 7.

Figure 8:
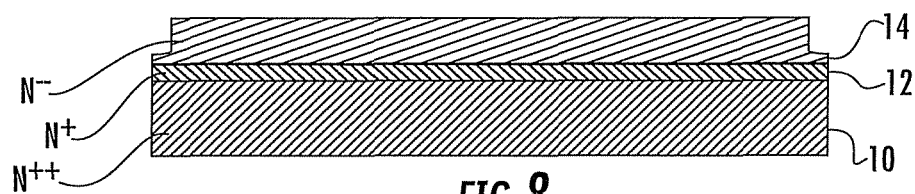

With an anisotropic calibrated dry etch conducted through the openings of the metallic hardmask, deep trenches (T) are cut into the silicon carbide of the thick lightly doped epilayer 14, and finally, the residual metal of the hard mask is removed by selective wet etch, leaving the structure schematically shown in FIG. 8. The depth of the trenches (T) may be insufficient to reach the bottom of the $N^{--}$ epilayer 14 or even extend down as far as reaching the bottom of the $N^{--}$ epilayer in case there is a buffer epilayer 12, as in the considered example. Essentially, there should not be any short circuiting condition with the ohmic contact to be formed on the bottom of the wafer. The designer may opt to extend down the cut trenches as far as possible in order to provide for the maximum possible depth (thickness) of the depletion region along the two sides of the trench Schottky contact or to etch more narrow trenches to reduce absorption of high wavelength photons, if this is desired by the particular application of the photodiode.

Figure 9:
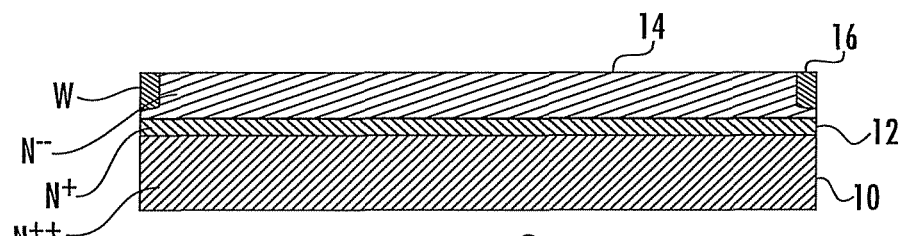

At this point of the process, to complete the active structure and the optical isolation between adjacent pixels, a metal layer 16 of Schottky contact (for example of tungsten) is deposited with a CVD process to completely fill the trenches up to the top, and with a tungsten etchback process, the metal is removed from the planar front surface the device, producing the structure schematically depicted in FIG. 9.

Figure 10:
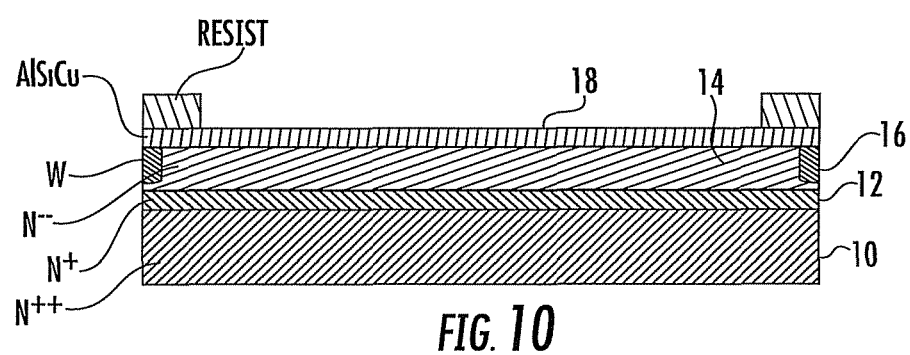
Figure 11:
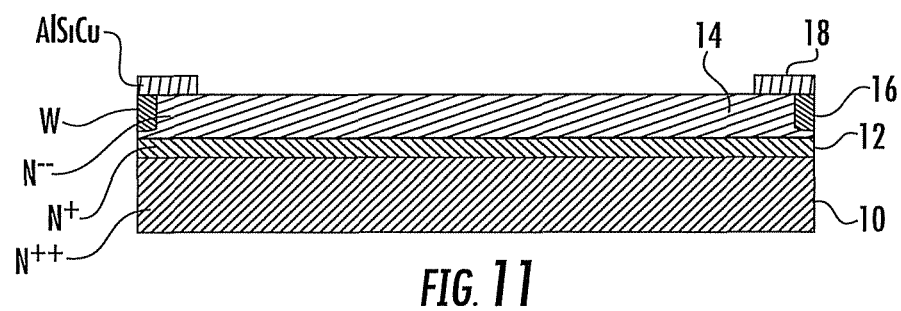

After that, a standard metal layer 18, for example an Al—Si—Cu ternary mixture/alloy, can be sputtered on the front surface of the wafer to contact the Schottky contact metal filler 16 of the trenches. The thickness of this metal layer 18 may be comprised in the range of 1 to 3 μm. By a second photolitography step, a resist mask (RESIST) is produced, as depicted in FIG. 10. By a selective wet etch process, the metal is removed from the surface of the device in the areas of separation among the trenches and after stripping of the masking resist, the structure depicted in FIG. 11 is obtained.

Figure 12:
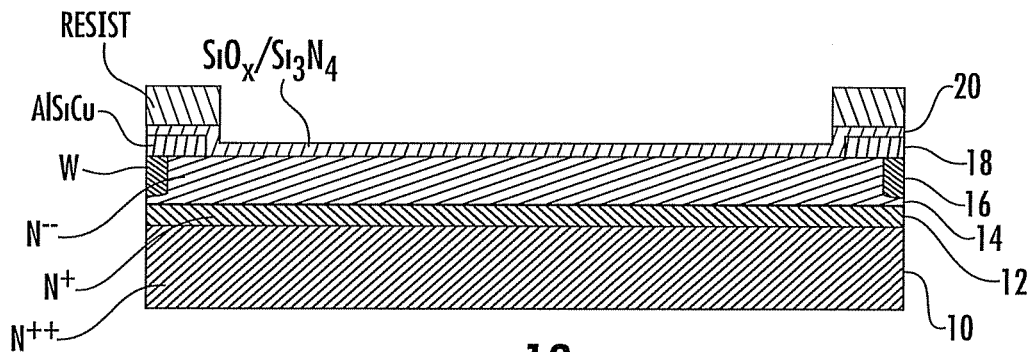

Then, a passivation layer 20, for example of silicon nitride or oxynitride, is deposited on the front of the wafer to coat the patterned metal layer 18. The thickness of this passivation layer 20 can be in the range from 0.3 to 1.0 μm. A third photolithography step a resist mask (RESIST) is produced, as depicted in FIG. 12.

Figure 13:
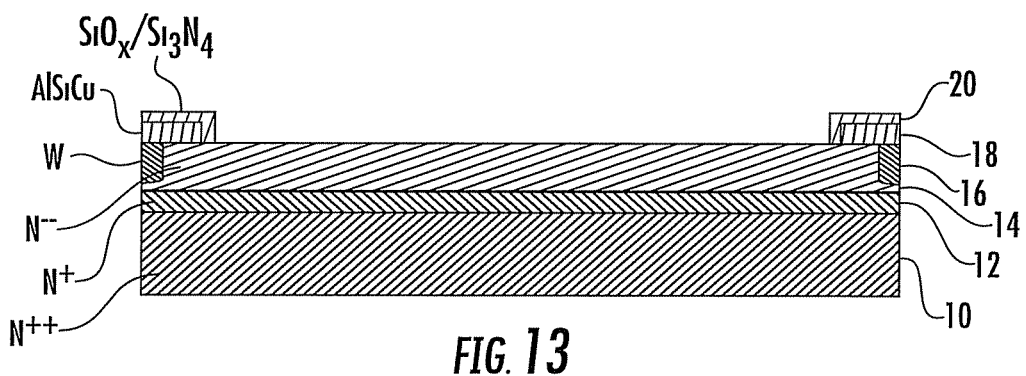

A dry etch process can be used for removing the passivation layer 20 in the areas of separation among the trenches defined by the openings of the resist mask that at the end of the etch may be stripped off, leaving the structure depicted in FIG. 13. A dielectric passivation layer strongly absorbs the radiation in the ultraviolet wavelength range eventually impeding detection of incident photons by the silicon carbide Schottky photodiode; therefore, it may be necessary to remove this layer between the parallel metal stripes in order to retain a high quantum efficiency in the UV range.

A sintering process at low temperature (generally at 400-450° C.) in hydrogen can be used to reduce the surface electronic states concentration and consequently the SRH (Schokley-Read-Hall) generation rate and the leakage current of the device.

A silicon carbide device usually exhibits a low thermal carrier generation due to the high energy gap of this material (about 3.26 eV for the 4H—SiC polytype). However, some silicon carbide devices may present a higher dark current due to a non-optimized manufacturing process or poor quality of the substrate and the epitaxial SiC layers. A low dark current is helpful for the proper working of a photo-detector permitting to set a lower magnitude limit to detectable signals. An excessively high dark current can impede the use of an SiC Schottky photodiode in many applications where weak photon fluxes may be detected, for example in astrophysical applications, where the photocurrent generated by the absorption of photons in the active area of the device may result many orders of magnitude lower than a particularly large leakage current. The main sequence of fabrication steps ends with the deposition of a metallization layer over the bottom surface of the SiC wafer of substrate 10, to establish the cathode ohmic contact of the vertical photodiode.

Figure 14:
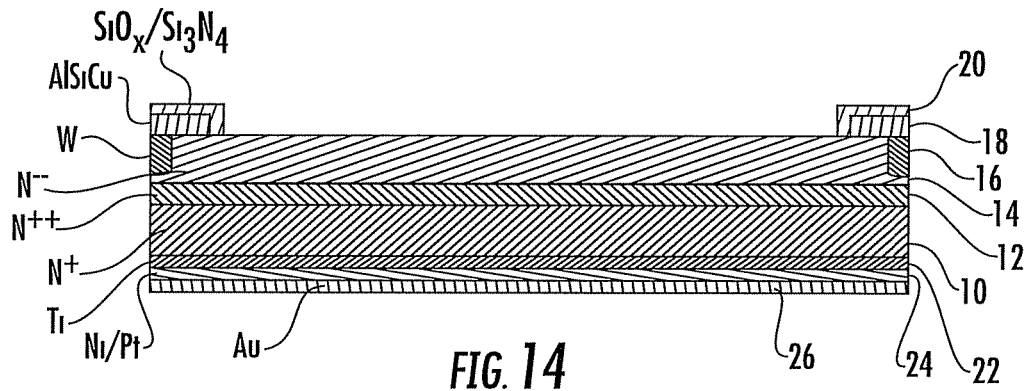

According to the exemplary process of the illustrated embodiment, three different metallic layers can be sputtered in succession on the rear surface of the substrate 10, as schematically depicted in FIG. 14. A first deposited layer 22 may be of a commonly used barrier metal such as titanium. The second deposited layer 24 may be of nickel or of platinum, and a third and last layer 26 may commonly be of gold.

The thickness of the barrier layer 22 may be in the range of 50-100 nm, that of the second layer 24 in the range of 200-500 nm, while the thickness of the outermost layer 26 may be in the range of 20-50 nm. The anode metallization layer 18 ensures easy wire bonding on the defined pad area, visible in the layout view of FIG. 2, (usually with aluminum or gold wires) while the metallic stack 22, 24, 26 at the rear of the wafer ensures an efficient die attach with soft solders or even with conductive adhesives.

Application of a low reverse bias voltage to the Schottky contact metal/semiconductor over the vertical side walls of the trenches creates in the flanking lightly doped semiconductor epilayer 14, depleted regions. By suitably designing the distance of separation between adjacent trenches, the pinch-off condition between adjacent depleted regions can be reached even at relatively low reverse bias or even under purely photovoltaic regime (0V bias).

Likewise the above-illustrated fabrication process for a single or for an array of SiC Schottky photodiodes (to constitute a bit-array photodetector) and the method of this disclosure may be followed by a realization of the trench sidewall contact Schottky photodiode with other monocrystalline semiconductor materials, suited to the wavelength range of the specific application, (e.g. silicon). In case of silicon, dielectric materials like silicon oxide, silicon nitride or oxynitride may conveniently be used as hard mask materials for the etching of the trenches.

Figure 15:
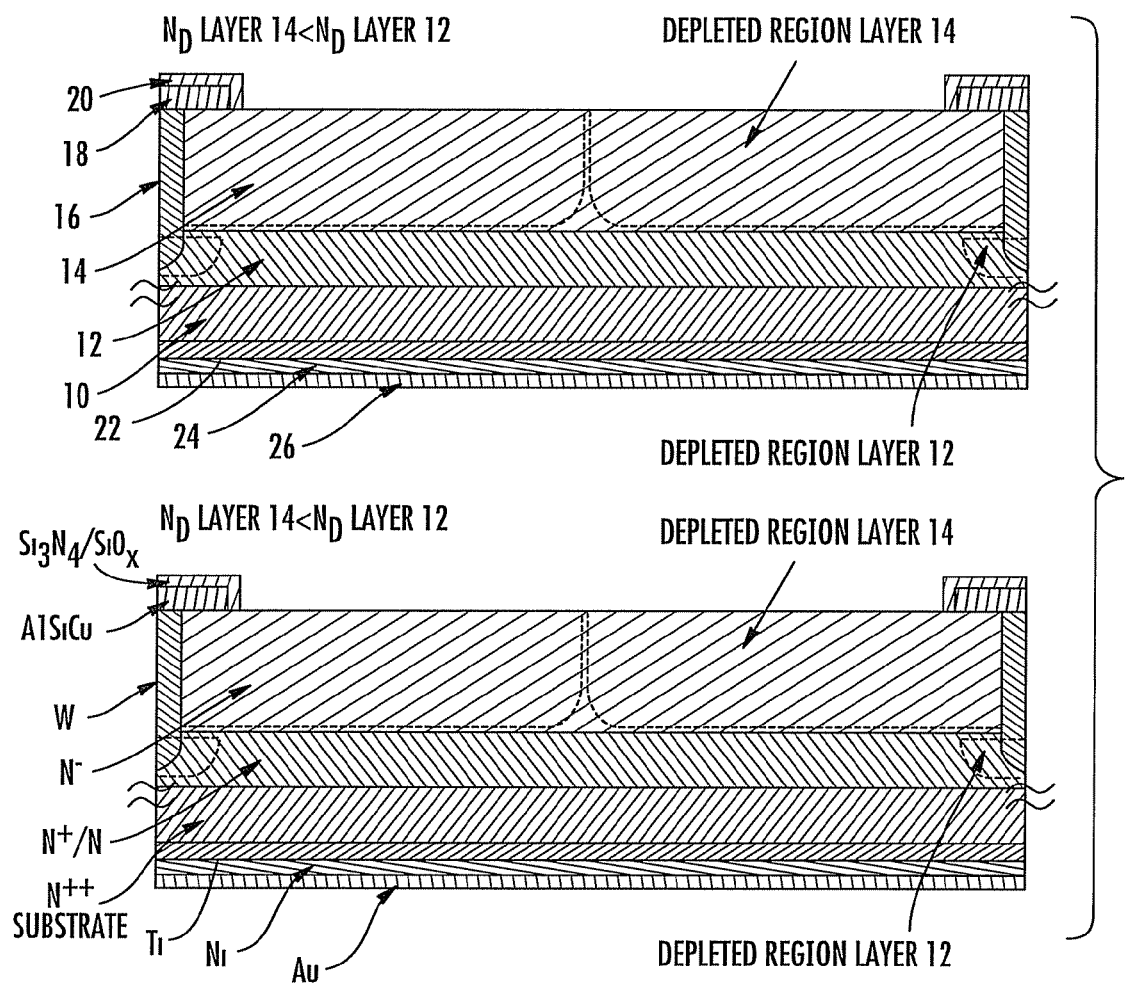
FIG. 15 is a schematic side view of a photodiode with two epitaxial layers made of different materials and/or different dopant concentrations and anode contacts that short them, according to the present disclosure.

FIG. 15, in accordance with an embodiment of the present disclosure, depicts a cross sectional view of a single multi-band trench sidewall contact Schottky photodiode. In the patent application [14], also assigned to the present application's assignee, a buried Schottky contact was disclosed in an homo-epitaxial structure (that is the epilayer material (typically 4H—SiC or Si) is of the same type of the substrate material) by etching deep trenches in a low doped epilayer and filling them with a high Schottky barrier metal. A method for the fabrication of these photodiodes was also presented in the same proposal. The possibility to etch deep trenches in a low doped epilayer was found to be a powerful tool to modulate, already at low reverse bias, the depletion layer thickness and consequently the absorption at high wavelengths where the absorption coefficient is low.

In FIG. 15, a first semiconductor layer 12 is deposited onto a heavily doped substrate while a second semiconductor layer 14 is deposited onto the first semiconductor layer 12. The doping of the substrate 10 and semiconductor layers 12 and 14 is of the same type (preferably N type) and more specifically the doping of the layers 10, 12 and 14 may be in the range $10^{18}$-$10^{19}$, $10^{15}$-$10^{16}$, $10^{13}$-$10^{14}$ cm$^{-3}$, respectively. The semiconductor layers materials 12 and 14 are different from one another while the substrate material 10 may be different or of the same type of the first semiconductor layer material 12. Typical thickness of the epilayers may range from a few micrometers to a few tens of micrometers according to optical absorption coefficient of the wavelength(s) to be detected by the different epilayers.

Moreover the semiconductor layers materials 12 and 14 are characterized by a different energy gap $E_g$ and consequently a different higher cut-off wavelength $\lambda_c$ according to the relation:

$$\lambda_c = \frac{hc}{E_g}$$

where h and c are the Planck constant and the speed of light in vacuum, respectively.

Referring to the structure in FIG. 15, it is supposed that the energy gap $E_{g1}$ of the first semiconductor material 12 is lower than the energy gap $E_{g2}$ of the second semiconductor material 14 while the energy gap of the substrate is not important for the proper working of the device since its role is simply to provide a good Ohmic contact at the back side of the photodiode. This means that the second semiconductor epilayer 14 is sensitive in a particular wavelength band while the first semiconductor epilayer 12 is sensitive in a wider wavelength band (including the one wherein the epilayer 14 is sensitive).

A typical sequence of materials which could be used for the structure presented in this disclosure are: substrate 10→Silicon; first semiconductor layer 12→Silicon (Si) ($E_{g1}$=1.1 eV, $\lambda_{c1}$=1100 nm); and second semiconductor layer 14→Gallium Nitride (GaN) ($E_{g2}$=3.4 eV, $\lambda_{c2}$=364 nm). The energy gap values are referred to room temperature.

The Radio Frequency Molecular Beam Epitaxy (RF MBE) technique used for the growth of nitride materials allows in fact the fabrication of multilayer structures that may incorporate binary, ternary or also quaternary nitride compounds with an accurate control over the layer thickness, crystalline quality, chemical composition and doping during a single-process growth on silicon, 4H—SiC or $Al_2O_3$ (sapphire) substrates [15], [16]. Moreover growth of Gallium Nitride layers on silicon wafers is particularly advantageous due to commercial and technological benefits provided by the well commercialized and mature silicon technology. Several groups in a recent past demonstrated low defects and high quality GaN electro-optic devices grown on silicon substrates.

The capability of GaN and Si to detect radiation in different wavelength bands and more specifically in the ultraviolet (UV) for Gallium Nitride and in visible and near infrared for silicon may be considered as additional benefits arising from the use of the silicon as substrate instead, for example, 4H—SiC which has an energy gap value (3.26 eV) similar to the energy gap of GaN. In this last case, both semiconductor layers would have similar optical absorption characteristics, being both sensitive only to wavelengths lower than approximately 380 nm, and this could reduce the usefulness of a photodiode realized by hetero-epitaxy of two or more layers of these materials. Deep trenches are etched in the structure and then filled with metal in order to form the rectifying (Schottky) contact in the bulk of the hetero-epitaxial structure.

The distance among adjacent trenches may be suitably designed in order to provide the pinch off condition among the depleted regions all around adjacent trenches in the first (12) and second (14) epitaxial layers at a pre-established reverse bias value according to the different dopings of the same epitaxial layers. The depth of the trench is insufficient to reach the bottom of the epilayer 12 in order to avoid any short circuiting condition with the Ohmic contact to be formed on the bottom of the wafer.

Equi-potential of the Schottky metal filler of all the trenches belonging to a single integrated photodiode, that may be cut parallel to each other with a uniform spacing, is provided by a metal anode current collecting metal layer 18, for example of an aluminum-silicon-copper layer sputtered over the surface and defined to form a capping in electrical contact with the metal filler 16 of the trenches.

A common dielectric passivating coat layer 20, for example silicon nitride or a partly oxidized silicon nitride layer, on the patterned metal anode current collector, completes the vertical structure of the trench sidewall contact Schottky photodiode of this disclosure and already presented in [14]. Of course, the metal anode current collecting metal layer 18 may have a pad area on which wire bonding connection of the anode to the photodetector circuitry may be established.

Finally, three different metallic layers may be sputtered in succession on the rear surface of the substrate 10, as schematically depicted in FIG. 15. A first deposited layer 22 may be of a commonly used barrier metal, such as titanium. The second deposited layer 24 may be of nickel or of platinum and a third and last layer 26 may commonly be of gold. The thickness of the barrier layer 22 may be in the range of 50-100 nm, that of the second layer 24 in the range of 200-500 nm, while the thickness of the outermost layer 26 may be in the range of 20-50 nm.

The application of a reverse bias to the Schottky photodiode depletes different areas of semiconductor in the epilayers 12 and 14 in relation to their different doping. More particularly, at a fixed reverse bias the depleted region may be wider in the second epitaxial layer 14 as it is represented by the dotted lines in FIG. 15, due to the lower doping of this layer. This means that for low reverse bias only the layer 14 may be active, being sensitive only to photons of the first wavelength band (in the case of GaN/Si trench sidewall Schottky photodiode only to near ultraviolet-blue photons (that is for λ lower than about $\lambda_{C\ GaN}$=364 nm) since the GaN layer is sensitive only to photons of these wavelengths).

By increasing the reverse bias, the pinch off condition among adjacent depleted regions in the second epilayer 14, corresponding to the condition of maximum detection efficiency in its sensitivity range, may be reached while the depleted area all around the trenches in the first epitaxial layer 12 may be limited due to its higher doping. The application of a higher reverse bias allows for widening of the depleted regions also in the epilayer 12 to such an extent that the pinch off condition may be reached also in this layer making the photodiode sensitive not only in the sensitivity range of the second epilayer but also in the sensitivity range of the first epilayer 12 (in the case of GaN/Si trench sidewall Schottky photodiode also to visible and near infrared photons up to λ of about $\lambda_{C\ Si}$=1100 nm, provided that the thickness of the epilayer 12 is such that a significant fraction of the photon flux at wavelengths near the cut off limit may be absorbed).

By tailoring the thickness and doping of the epitaxial layers 12 and 14 and suitably choosing the distance among adjacent trenches three working regimes may be defined for such a vertical Schottky multi-band photodiode depending on the reverse voltage V applied on the photodiode: 0<V≦Vp14→only the upper semiconductor epilayer (14) is sensitive to photons in its sensitivity range (λ≦λ C14 where λ C14 is the cut-off wavelength of the epilayer 14) with an increasing efficiency proportional to the reverse applied bias voltage (V). The maximum photon detection efficiency is reached at the pinch off reverse bias voltage Vp14. In this reverse voltage range, the sensitivity of the first epitaxial layer 12 may be considered limited or negligible due to the reduced extension of the depleted region in this layer; Vp14<V≦Vp12→the second semiconductor epilayer 14 continues to detect photons in its wavelength sensitivity range with maximum photon detection efficiency while the detection efficiency of the first epitaxial layer 12 increases with the applied reverse bias in its proper sensitivity range (λ≦λ C14≦λ C12 where λ C12 is the cut-off wavelength of the epilayer 12). The maximum detection efficiency for photons in the sensitivity range of the epilayer 12 is reached at the pinch off reverse bias Vp12; V≧Vp12→the device operates at its maximum detection efficiency in the whole sensitivity range of the multi-band photodetector determined by the different materials used for the realization of this heteroepitaxial structure along with the thicknesses of the same epitaxial layers.

This means that it is sufficient to switch the applied reverse bias from a low value to a high value, which depend on the characteristics of the epilayers (type of materials, doping and thickness) and the metal filler (through its work function) to modify the optical absorption properties of this vertical Schottky multi-band photodiode and make it sensitive in two different wavelength ranges (for instance from only near UV-blue photons to also visible and near infrared photons in the GaN/Si trench sidewall Schottky photodiode).

The bias and consequently the absorption band switching may be carried out in a very short time and this give the possibility to perform time resolved measurements in different optical bands with a very fast response time along with a high spatial resolution due to the combination of materials with different optical absorption properties in a monolithic broad band photodiode.

Moreover the stacked epilayers are contacted through a common anode contact and this reduces the number of terminals to be contacted. In [20] for instance, the different epilayers are contacted through distinct electrode contacts. In addition, the buried Schottky contact allows an accurate control of the lateral depleted area width all around the trenches in both semiconductor epilayers and this in turn implies that such a structure allows a precise control of the photodiode optical absorption properties with the applied reverse bias unlike to what happens for typical Schottky photodiode structures with the rectifying contact on the top (or the bottom) of the stacked structure.

By choosing different epilayer thickness and doping also, the optical absorption characteristics of each epilayer may be tuned according to the particular application where the detector has to be used. In fact the lateral depleted area depends on the epilayer doping along with the applied reverse bias and the characteristics of the Schottky contact (through the barrier height) while the absorption at a fixed wavelength depends on the material thickness x through the Lambert-Beer law:

$$I(x,\lambda)=I_o \exp^{-(\alpha x)};$$

where Io is the incident light intensity at the Schottky photodiode surface while α is the absorption coefficient at the wavelength λ.

The Schottky contact has different characteristics in the two different epilayer materials, due to their different electron affinities and semiconductor permittivity. The barrier height is defined as the difference between the metal work function and the electron affinity of the semiconductor and contributes to the definition of the built-in potential; therefore to determine the variation of the depletion layer thickness as a function of the applied reverse bias, it is important to consider the different values of the permittivity and built-in potential in each epilayer. However the differences between these parameters for each one of the typical materials which could be used for the fabrication of this photodiode are usually low [17].

The structure disclosed in this disclosure has not to be considered valid only for hetero-epitaxial structures. In fact one may think to use epilayers of the same material but characterized by different thickness and/or doping concentrations and/or widths between adjacent anode contacts in the same structure disclosed herein. In this case, by finely tuning these parameters and increasing the reverse bias applied to the device, it is possible to make this photodiode selectively active in different portions of the material sensitivity wavelength range.

Nevertheless, the validity of the structure and its working principle here presented is not only limited to the case where the upper epilayer has a lower doping and higher energy gap (shorter cut-off wavelength) with respect to the lower epitaxial layer. It may be possible to realize, for example, a Schottky photodiode structure with an upper epilayer doping and energy gap higher than those of the lower epilayer. In this case at low reverse bias, the device would be only sensible to wavelengths at the high end of the sensitivity range of the lower epilayer material (to visible-near infrared photons for a GaN/Si Schottky structure) while the increase of the reverse bias may be active also the upper epilayer making the whole photodiode sensitive in its own wavelength sensitivity range (blue-near UV photons for a GaN/Si Schottky structure). In this last case, the doping of the substrate 10 and semiconductor layers 12 and 14 are of the same type (preferably N type), and more specifically, the doping of the layers 10, 12 and 14 may be in the range 1018÷1019, 1013÷1014 cm-3 and 1015÷1016, respectively.

Moreover, the disclosed structure may offer the outstanding possibility to allow first (at lower reverse bias voltages) the depletion of the epitaxial layers in the bulk of the device, and after (at higher reverse bias voltages) the depletion of the surface epitaxial layer. This may be simply accomplished by choosing for these layers a doping lower than the one used for the surface epitaxial layer. This characteristic may be used to make the device sensitive only in the wavelength ranges where the underlying epitaxial layers are sensitive and may not be obtained in conventional Schottky photodiode structures with a continuous or interdigit surface contact on the top side of the device. In this last case, the depletion may begin only from the higher (surface) epitaxial layer.

Figure 16:
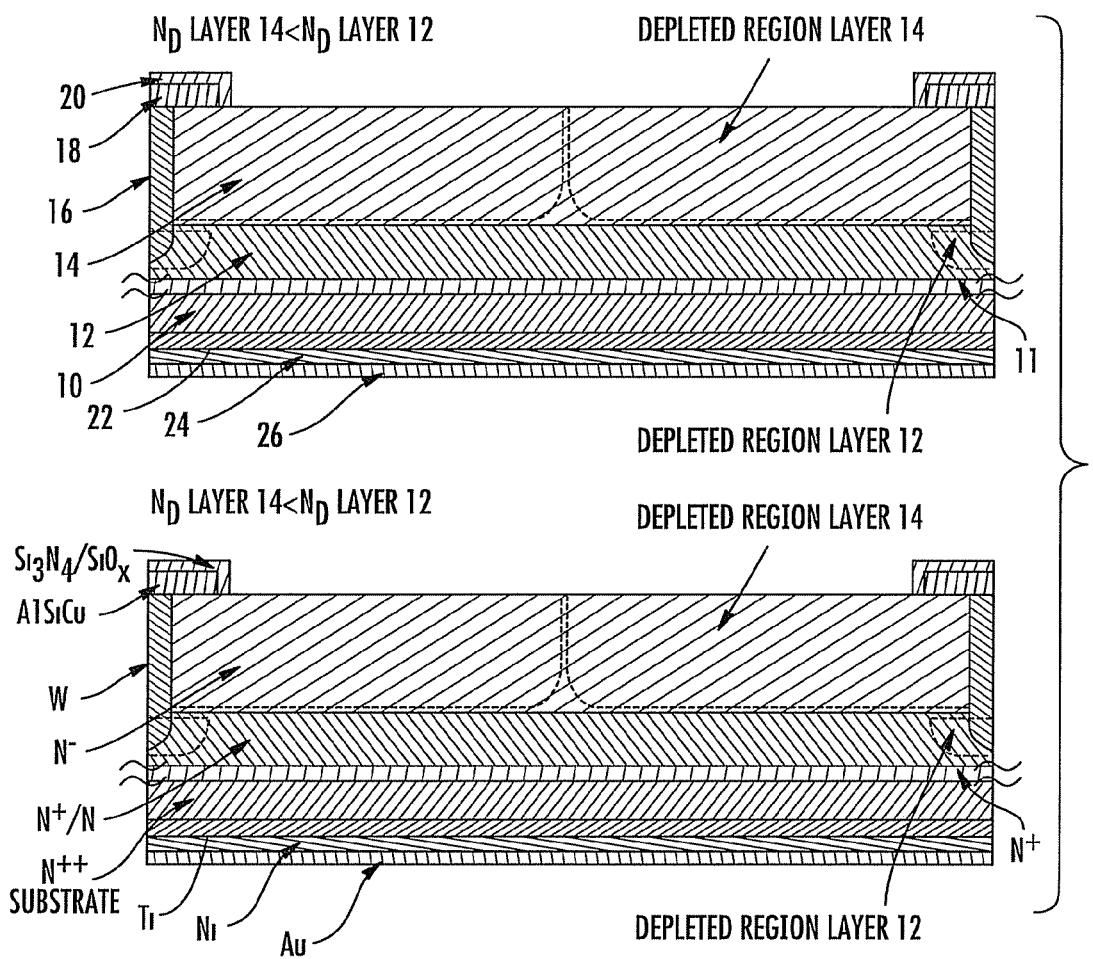
FIG. 16 is a schematic side view of another architecture similar to that of FIG. 15 with a buffer layer between the substrate and the first innermost epitaxial layer, according to the present disclosure.

In FIG. 16, the buffer layer 11 is introduced between the substrate 10 and the first semiconductor epilayer 12. The doping of the layer is in between the doping values of the substrate and the first semiconductor epilayer 12 while the material used for the buffer layer may be the same used for the substrate 10 and the semiconductor epilayer 12, if the same material is used for the deposition of these layers; otherwise, a third material with chemical and physical properties in between the properties of the substrate 10 and semiconductor epilayer 12 may be used.

Figure 17:
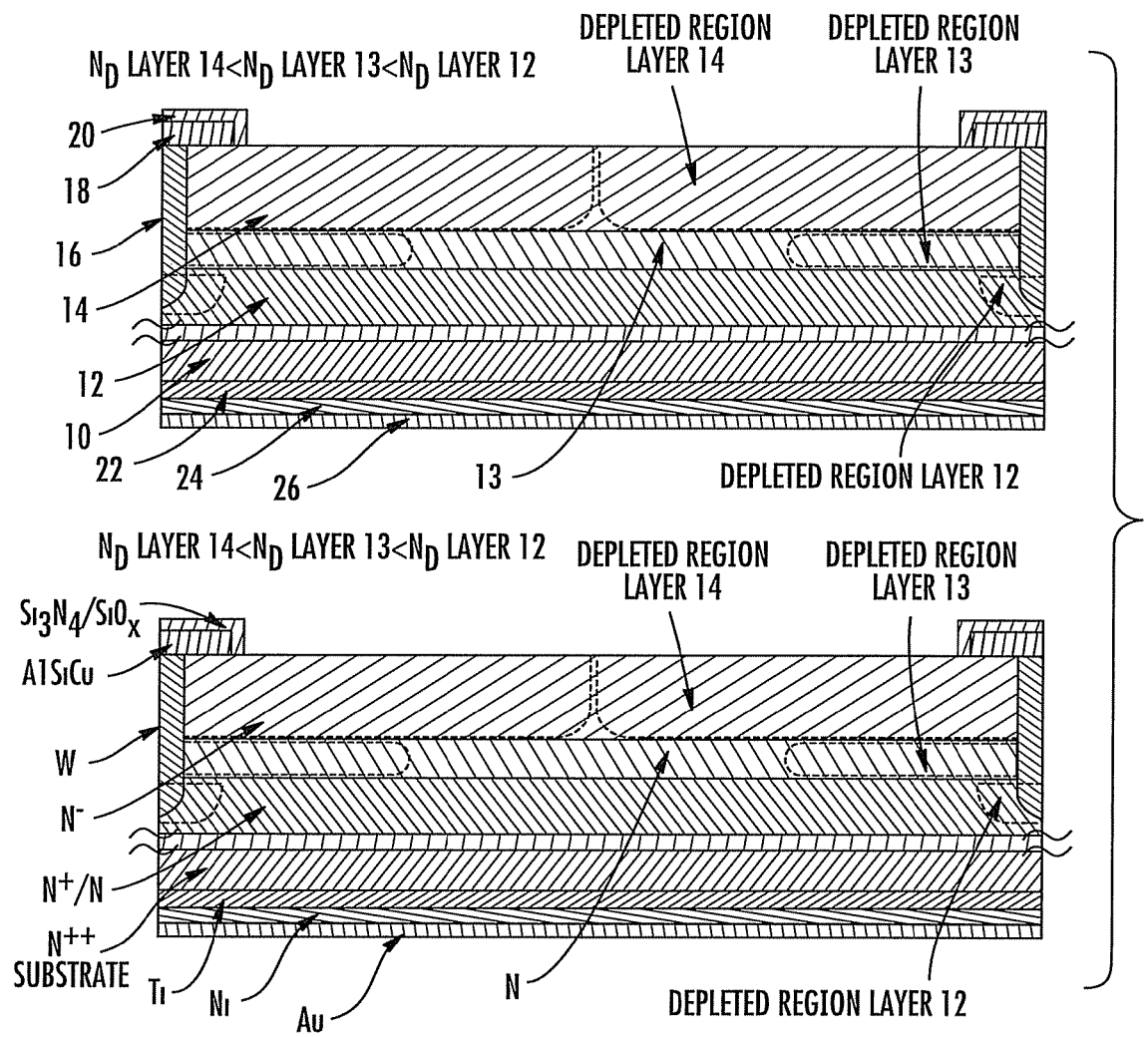
FIG. 17 is a schematic side view of another architecture similar to that of FIG. 15 with a buffer layer between the two epitaxial layers, according to the present disclosure.

In FIG. 17, a third epitaxial layer 13 is introduced between the epilayers 12 and 14. In this case, it is supposed that the layer 13 has a doping in between the dopings of layers 12 and 14. Moreover, as it has been already done for the description of the structure in FIG. 15, it may be supposed that the energy gap of this layer is higher than the band gap of the layer 12 but lower than the one of the layer 14.

Typical materials that may be used for the realization of this multilayer stacked structure could be II-VI (typically Zn1-xCdxTe) [15] or III-V (AlxGa1-xN) [21] semiconductor compounds. The energy gap Eg of a generic material of type AxB1-xC depends on the relative concentration x of the elements A and B in the compound. This dependence may be approximately expressed by the following law: Eg(AxB1-xC)=x Eg(AC)+(1-x) Eg(BC), where AC and BC are the single binary compound. As an example, for the compound AlxGa1-xN Eg(AlxGa1-xN)=x Eg(AlN)+(1-x) Eg(GaN) If x=0→Eg (GaN)=3.4 eV while if x=1→Eg (AlN)=6.3 eV If 0≦x≦1, the energy gap of the ternary semiconductor compound approximately linearly increases with the concentration of aluminum. Three or more layers with different thickness, doping and concentration x of the single elements in the compound (and consequently different energy gap) may be stacked on the same highly doped substrate.

Figure 18:
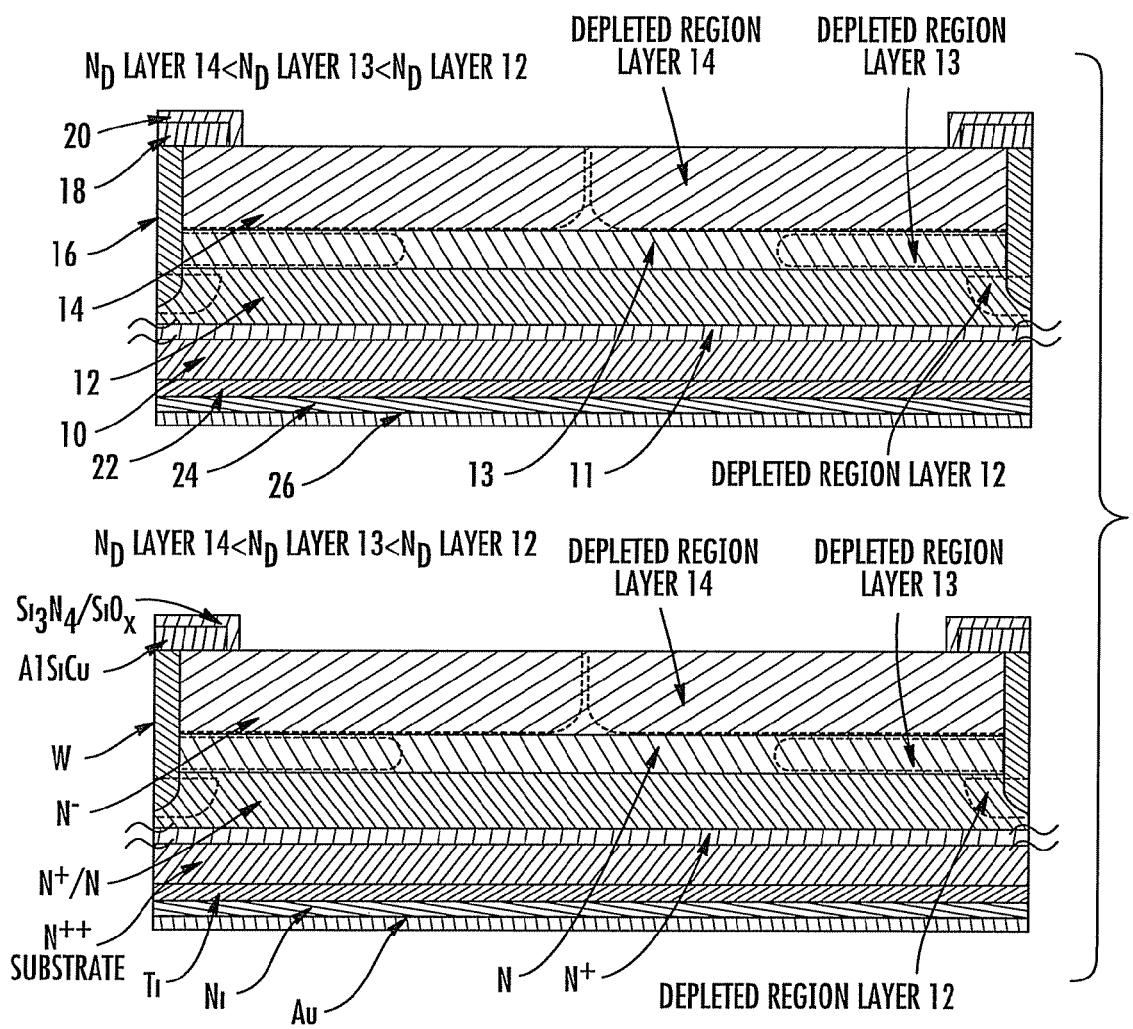
FIG. 18 is a schematic side view of another architecture similar to that of FIG. 15 with a first buffer layer between the substrate and the first innermost epitaxial layer and a second buffer layer between the two epitaxial layers, according to the present disclosure.

Alternatively the same material or up to three different materials layers with different thickness, doping and energy gap could be used for the realization of the structure presented in FIG. 18. In such a structure, considering that the layer 13 has a doping and an energy gap in between those of the layers 12 and 14, a further pinch off voltage and higher cut-off wavelength in between those of the same layers 12 and 14 may be introduced, in a similar way to what already explained for the structure in the FIG. 15.

In this way the device is made sensitive in three different optical bands (or three different portions of the same wavelength band) and the photo response in each wavelength band is precisely controlled by applying an increased reverse bias to the photodiode. More than 3 layers made of different materials and with different thickness and doping could be used to obtain a single monolithic photodiode sensitive to multiple wavelength bands characterized by different higher cut-off wavelengths with the response in each band accurately being bias controlled.

In FIG. 18, the same structure of FIG. 17 is presented but with a buffer layer 11 between the substrate 10 and the first semiconductor epilayer 12. A plurality of these photodiodes organized in two-dimensional arrays may be realized. In this configuration, the deep trenches filled with metal may minimize optical cross talk effects among adjacent photodiodes due to the recombination of photo generated electron-hole pairs.

Figure 19:
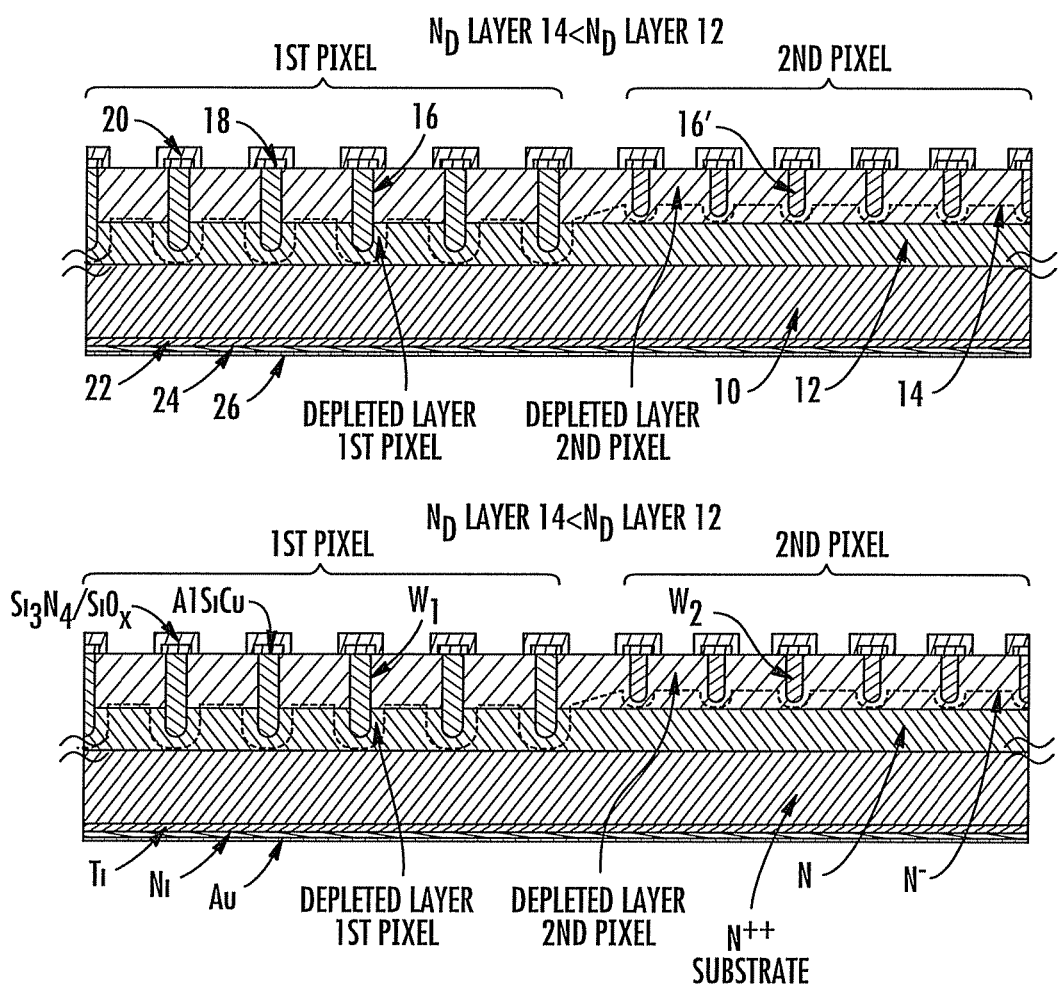
FIG. 19 is a schematic side view of a photodiode of FIG. 15 and a prior art photodiode of an array of photodiodes for determining on which cell a photon has impinged even with a single anode connection.

In FIG. 19, two adjacent trench sidewall Schottky photodiodes sensitive to different wavelength bands are represented. This may be accomplished by etching trenches of different depth in the same hetero-epitaxial structure already disclosed in the FIG. 15. More particularly, the depth of trenches in the photodiode at the right in FIG. 19 approximately equals the thickness of the second epitaxial layer 14. Therefore, this photodiode is sensitive to a particular wavelength band depending on the material used to deposit this epilayer along with, obviously, its thickness since the absorbed light intensity depends on the epilayer thickness through the Lambert-Beer law above reported. The increase of the detection efficiency of this photodiode in this wavelength band with the applied reverse voltage may be mainly determined by the doping of this layer. The photodiode at the left in the figure has deeper trenches which cut the second (14) and first epitaxial layers (12). In the figure, it is supposed that the doping of the first epilayer 12 is higher than the one of the second epilayer 14; therefore, if a common anode contact may be used to simultaneously bias both photodiodes, also the first photodiode may be sensitive to the same wavelength range of the second photodiode. However by further increasing the applied reverse bias, also the area among adjacent trenches in the first epilayer 12 may be depleted and this may make the first device sensitive in a wider wavelength band while the second photodiode may continue to detect radiation in its own wavelength band at the maximum efficiency, provided that the pinch off reverse voltage in this layer is obviously reached.

Alternatively, it is possible to bias the two devices through different anode metallizations while the cathode contact on the back side of the device may be common to both photodiodes. In this case the devices are independent and different reverse bias could be used to bias the photodiodes and modulate their optical absorption properties according to the particular application where the photo detectors have to be used. In this embodiment, two or more photodiodes sensitive to different wavelength bands are realized in a single monolithic chip by using the same process flow and consequently they may be realized as close as possible by increasing the spatial resolution of the whole detection system. The process flow disclosed in the patent application [19], assigned to the present application's assignee, may be used to fabricate the two photodiodes. The design and concept illustrated in FIG. 19 may be extended to a plurality of photodiodes arranged in two-dimensional arrays and whose absorption properties in different wavelengths bands or different portions of the same wavelength band may be modulated and bias controlled by using epilayers made of different materials and characterized by different thickness and dopings and by opportunely tailoring the thickness and distance among adjacent trenches.

Figure 20:
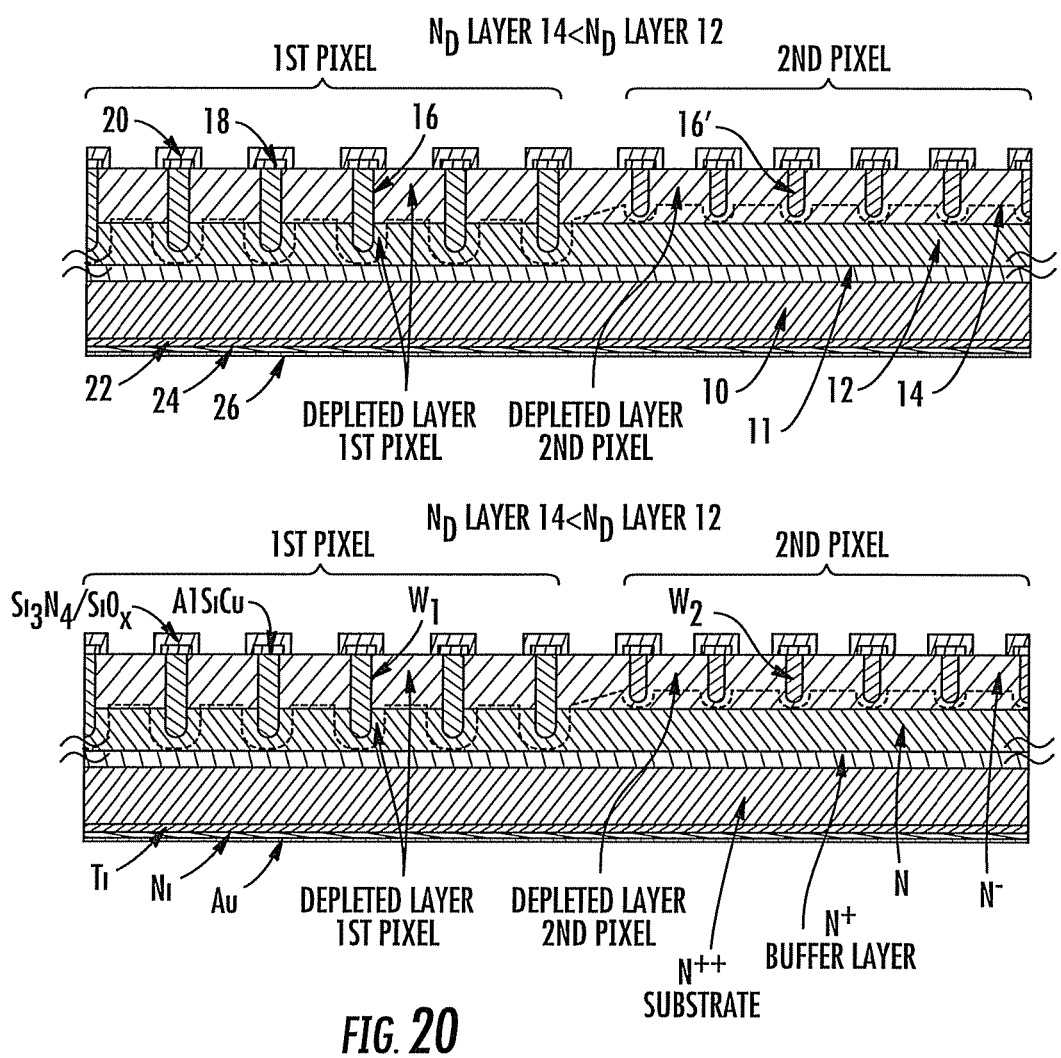
FIG. 20 depicts a photodiode of FIG. 16 and a prior art photodiode of an array of photodiodes for determining on which cell a photon has impinged even with a single anode connection, according to the present disclosure.

In FIG. 20, a buffer layer 11 between the substrate 10 and the semiconductor epilayer 12 is introduced.

REFERENCES

[1] M. Razeghi and A. Rogalski, Semiconductor ultraviolet detectors, Applied Physics Reviews, Vol. 79, No. 10, pp. 7433-7473, 1996.

[2] P. Sandvik*, K. Burr, S. Soloviev, S. Arthur, K. Matocha, J. Kretchmer, Leo Lombardo, D. Brown, Sic Photo-detectors for industrial applications, IEEE Lasers and Electro-Optics Society, 2005. LEOS 2005, pp. 319-320.

[3] J. A. Edmond and C. H. Carter, High sensitivity ultraviolet radiation detector, US005093576A, March 1992

[4] P. Sandvik, D. M. Brown, S. D. Arthur, K. S. Matocha and J. W. Kretchmer, Detection system including avalanche photodiode for use in harsh environments, U.S. Pat. No. 7,002,156B2, February 2006.

[5] I. Masanori, Metal-Semiconductor-Metal Photodiode, U.S. Pat. No. 4,763,176, July 1987.

[6] A. Sciuto, F. Roccaforte, V. Raineri, S. Di Franco, G. Bonanno, High responsivity 4H—SiC Schottky UV photodiodes based on the pinch-off surface effect, Applied Physics Letters, Vol. 89, 081111, 2006.

[7] F. Yan, X. Xin, S. Aslam, Y. Zhao, D. Franz, J. H. Zhao, and Maurice Weiner, 4H—SiC UV Photo Detectors With Large Area and Very High Specific Detectivity, IEEE J. Quantum Electron. Vol. 40, No. 9, pp 1315-1320, 2004.

[8] H. Y. Cha and P. M. Sandvik, Electrical and Optical Modeling of 4H—SiC Avalanche Photodiodes, Japanese Journal of Applied Physics, Vol. 47, No. 7, pp. 5423-5425, 2008.

[9] J. Hu, X. Xin, X. Li, J. H. Zhao, B. L. VanMil, K. Lew, R. L. Myers-Ward, C. R. Eddy, Jr., and D. K. Gaskill, 4H—SiC Visible-Blind Single-Photon Avalanche Diode for Ultraviolet Detection at 280 and 350 nm, IEEE Transactions on Electron Devices, Vol. 55, No. 8, pp. 1977-1982, 2008.

[10] G. Abbondanza and D. Crippa, Process for producing a silicon carbide substrate for microelectronics applications, WO 2008080384.

[11] L. J. Evans and G. M. Beheim, Deep Reactive Ion Etching (DRIE) of High Aspect Ratio SiC Microstructures using a Time Multiplexed Etch-Passivate Process www.n-trs.nasa.gov/archive/nasa/casi.ntrs.nasa.gov/20060005134_20 06005298.pdf

[12] S. Grunow, A. Kumar Kaushik, K. S. Petrarca, P. R. Volant, Method for forming conductive structures, US 2009017616.

[13] S. M. Sze, Semiconductor Devices Physics and Technology. New York: Wiley, 1985.

[14] M. C. Mazzillo, Trench sidewall contact Schottky photodiode and related method of fabrication, VA2009A000033, Filed on 1 Jun. 2009.

[15] A. Strittmatter et al., Low-pressure metal organic chemical vapor deposition of GaN on silicon(111) substrates using an AlAs nucleation layer, Applied Physics Letters, Vol. 74, pp. 1242-1244, 1999.

[16] S. Pal and C. Jacob, Silicon—a new substrate for GaN growth, Bull. Mater. Sci., Vol. 27, No. 6, pp. 501-504, 2004.

[17] S. M. Sze, Semiconductor Devices Physics and Technology. New York: Wiley, 1985.

[18] M. Becerril et al., Band gap energy in Zn-rich Zn1-xCdxTe thin films grown by r.f.sputtering, Revista Mexicana de Fisica, Vol. 50, No 6, pp. 588-593, 2004.

[19] M. Mazzillo, Multiplexed output two terminal photodiode array for imaging applications and related fabrication process, VA2009A000062, filed on 2 Oct. 2009

[20] D. Starikov et al., Single-chip monolithic dual-band visible or solar blind photodetector, US Pat. No 2007/0241279.

[21] K. P. Korona et al., Multiband GaN/AlGaN UV Photodetector, Acta Physica Polonica A, Vol. 110, No 2, pp. 211-217, 2006.

That which is claimed is:

1. A Schottky photodiode comprising:
a semiconductor substrate having a front surface and a rear surface, the rear surface to define a cathode;
a first epitaxial layer of a first conductivity type over the front surface of said semiconductor substrate and having associated dopant concentration and energy gap values;
at least one second epitaxial layer of a second conductivity type over said first epitaxial layer and having associated dopant concentration and energy gap values;
a plurality of spaced trenches in said at least one second epitaxial layer crossing therethrough and reaching into said first epitaxial layer;
a metal layer in said plurality of spaced trenches and cooperating with said first and said at least one second epitaxial layers to define a Schottky rectifying contact and respective anode contacts, each anode contact having a spacing and a thickness based upon the respective spaced trench;
an anode current distributor metal layer over said first epitaxial layer, contacting with said metal layer in said plurality of spaced trenches, and to be coupled to a circuit;
a dielectric passivation layer over said anode current distributor metal layer; and
a conductive layer over the rear surface of said semiconductor substrate to define an ohmic contact with the cathode and to be coupled to the circuit;
the thickness and the spacing between adjacent anode contacts and the dopant concentration and energy gap values of said first and said at least one second epitaxial layers causing said first and said at least one second epitaxial layers to deplete at different applied anode-cathode voltages.

2. The Schottky photodiode of claim 1 wherein said semiconductor substrate and said first epitaxial layer comprise silicon; and wherein said at least one second epitaxial layer comprises gallium nitride.

3. The Schottky photodiode of claim 2 further comprising an epitaxial buffer layer between said semiconductor substrate and said first epitaxial layer, said epitaxial buffer layer comprising silicon.

4. The Schottky photodiode of claim 3 wherein said epitaxial buffer layer has a thickness comprised between 0.5 and 3 µm and a dopant concentration value between a dopant concentration value of said semiconductor substrate and the dopant concentration value of said first epitaxial layer.

5. The Schottky photodiode of claim 3 wherein said semiconductor substrate and said first epitaxial layer comprise differing semiconductor materials.

6. The Schottky photodiode of claim 5 further comprising an epitaxial buffer layer between said semiconductor substrate and said first epitaxial layer, said epitaxial buffer layer comprising a material with a thickness and a dopant concentration value between the corresponding values for said semiconductor substrate and said first epitaxial layer.

7. The Schottky photodiode of claim 1 further comprising at least one third epitaxial layer between said first epitaxial layer and said at least one second epitaxial layer.

8. The Schottky photodiode of claim 7 wherein said at least one third epitaxial layer comprises a material with an energy band-gap value between the energy band-gap values of said first epitaxial layer and said at least one second epitaxial layer.

9. The Schottky photodiode of claim 8 wherein said at least one third epitaxial layer has a thickness between 3 and 30 μm and a dopant concentration value between the dopant concentration values of said first epitaxial layer and said at least one second epitaxial layer.

10. A Schottky photodiode comprising:
a first epitaxial layer of a first conductivity type having associated dopant concentration and energy gap values;
a second epitaxial layer of a second conductivity type over said first epitaxial layer and having associated dopant concentration and energy gap values;
a plurality of spaced trenches in said second epitaxial layer crossing therethrough and reaching into said first epitaxial layer; and
a metal layer in said plurality of spaced trenches and cooperating with said first and second epitaxial layers to define a Schottky rectifying contact and respective anode contacts, each anode contact having a spacing and a thickness based upon the respective spaced trench, the thickness and the spacing between adjacent anode contacts and the dopant concentration and energy gap values of said first and second epitaxial layers causing said first and second epitaxial layers to deplete at different applied anode-cathode voltages.

11. The Schottky photodiode of claim 10 wherein said first epitaxial layer comprises silicon; and wherein said second epitaxial layer comprises gallium nitride.

12. The Schottky photodiode of claim 10 further comprising an epitaxial buffer layer adjacent said first epitaxial layer, said epitaxial buffer layer comprising silicon.

13. A multi-pixel photo detector array comprising:
a plurality of Schottky photodiodes over at least one semiconductor substrate and configured to perform imaging applications with monochromatic radiation, each photodiode comprising
a first epitaxial layer of a first conductivity type having associated dopant concentration and energy gap values,
a second epitaxial layer of a second conductivity type over said first epitaxial layer and having associated dopant concentration and energy gap values,
a plurality of spaced trenches in said second epitaxial layer crossing therethrough and reaching into said first epitaxial layer, and
a metal layer in said plurality of spaced trenches and cooperating with said first and second epitaxial layers to define a Schottky rectifying contact and respective anode contacts, each anode contact having a spacing and a thickness based upon the respective spaced trench, the thickness and the spacing between adjacent anode contacts and the dopant concentration and energy gap values of said first and second epitaxial layers causing said first and second epitaxial layers to deplete at different applied anode-cathode voltages;
said plurality of Schottky photodiodes having a common cathode contact to define a first connection, and a common anode contact to define a second connection and being adjacent with the metal layer of said plurality of Schottky photodiodes.

14. The multi-pixel photo detector array of claim 13 wherein outputs of said plurality of Schottky photodiodes are multiplexed.

15. The multi-pixel photo detector array of claim 13 wherein said plurality of spaced trenches of each Schottky photodiode have identical depth and uniform spacing for forming the common anode contact.

16. The multi-pixel photo detector array of claim 15 wherein the depth of the spaced trenches and spacing among them being configured to produce a pinch-off condition and a depth of an associated depletion layer of the Schottky photodiode in different from other photodiodes.

17. The multi-pixel photo detector array of claim 13 wherein said first epitaxial layer comprises silicon; and wherein said second epitaxial layer comprises gallium nitride.

18. The multi-pixel photo detector array of claim 13 further comprising an epitaxial buffer layer adjacent said first epitaxial layer, said epitaxial buffer layer comprising silicon.

19. A method of making a Schottky photodiode over a semiconductor substrate comprising:
forming a first epitaxial layer of a first conductivity type over a front side of the semiconductor substrate;
forming a second epitaxial layer of a second conductivity type over the first epitaxial layer;
depositing a metal mask layer;
defining an array of spaced openings through the metal mask layer by a first lithography step;
anisotropically etching the semiconductor of the second epitaxial layer to cross it and reach the first epitaxial layer through openings of the metal mask layer to form trenches and removing residual metal of the metal mask layer;
depositing a first metal layer for filling the trenches to define Schottky contacts and etching back the deposited metal for removal from a front surface of the Schottky photodiode;
depositing a second metal layer over the front surface in contact with the Schottky contacts of the trenches;
defining an anode current distributor from the deposited second metal layer for connecting in common the Schottky contacts of the trenches and forming an anode terminal of the Schottky photodiode by a second lithography step and selective wet etch process;
depositing a passivation layer over the front surface for covering the second metal layer;
removing the passivation layer in areas of separation among portions of the anode current distributor defined over the metal filled trenches by a third lithography step and dry etch process; and
depositing a third metal layer over a rear surface of the semiconductor substrate for defining a cathode terminal.

20. The method of claim 19 wherein the semiconductor substrate has a dopant concentration value between 1E18 and 1E19 atoms/cm$^3$.

21. The method of claim 20 wherein the first epitaxial layer has a dopant concentration value of a same type of conductivity of the dopant of the semiconductor substrate and between 1E15 and 1E16 atoms/cm$^3$.

22. The method of claim 20 wherein the second epitaxial layer has a dopant concentration value between 1E13 and 1E14 atoms/cm$^3$.

23. The method of claim 19 wherein defining the array of the spaced openings comprises defining the array to have uniformly spaced parallel openings.

24. A method of making a Schottky photodiode comprising:
- forming a first epitaxial layer of a first conductivity type having associated dopant concentration and energy gap values;
- forming a second epitaxial layer of a second conductivity type over the first epitaxial layer and having associated dopant concentration and energy gap values;
- forming a plurality of spaced trenches in the second epitaxial layer crossing therethrough and reaching into the first epitaxial layer; and
- forming a metal layer in the plurality of spaced trenches for cooperating with the first and second epitaxial layers to define a Schottky rectifying contact and respective anode contacts, each anode contact having a spacing and a thickness based upon the respective spaced trench, the thickness and the spacing between adjacent anode contacts and the dopant concentration and energy gap values of, the first and second epitaxial layers causing the first and second epitaxial layers to deplete at different applied anode-cathode voltages.

25. The method of claim 24 wherein the first epitaxial layer comprises silicon; and wherein the second epitaxial layer comprises gallium nitride.

26. The method of claim 24 further comprising forming an epitaxial buffer layer adjacent the first epitaxial layer, the epitaxial buffer layer comprising silicon.

\* \* \* \* \*